(12) United States Patent
Kim

(10) Patent No.: US 8,603,873 B2
(45) Date of Patent: Dec. 10, 2013

(54) HIGH-GAIN BIPOLAR JUNCTION TRANSISTOR COMPATIBLE WITH COMPLEMENTARY METAL-OXIDE-SEMICONDUCTOR (CMOS) PROCESS AND METHOD FOR FABRICATING THE SAME

(75) Inventor: Je-Don Kim, Seoul (KR)

(73) Assignee: Samsung Electronics Co., Ltd., Suwon-Si, Gyeoggi-Do (KR)

(*) Notice: Subject to any disclaimer, the term of this patent is extended or adjusted under 35 U.S.C. 154(b) by 795 days.

(21) Appl. No.: 12/794,355

(22) Filed: Jun. 4, 2010

(65) Prior Publication Data

US 2010/0317165 A1 Dec. 16, 2010

Related U.S. Application Data

(62) Division of application No. 11/303,885, filed on Dec. 16, 2005, now Pat. No. 7,745,882.

(30) Foreign Application Priority Data

Dec. 17, 2004 (KR) ................................ 2004-108013

(51) Int. Cl.
*H01L 21/8238* (2006.01)

(52) U.S. Cl.
USPC ........................... 438/202; 438/204; 438/207

(58) Field of Classification Search
USPC ........................................ 438/207, 202, 204
See application file for complete search history.

(56) References Cited

U.S. PATENT DOCUMENTS

| | | | | |
|---|---|---|---|---|
| 5,015,594 A | * | 5/1991 | Chu et al. | ...................... 438/207 |
| 5,066,602 A | * | 11/1991 | Takemoto et al. | ............ 438/203 |
| 5,354,699 A | * | 10/1994 | Ikeda et al. | .................... 438/234 |
| 5,439,833 A | * | 8/1995 | Hebert et al. | .................. 438/203 |
| 5,502,317 A | * | 3/1996 | Duvvury | ........................ 257/107 |
| 6,030,864 A | * | 2/2000 | Appel et al. | ................... 438/234 |
| 6,303,420 B1 | * | 10/2001 | Sridhar et al. | ................ 438/202 |
| 6,440,787 B1 | * | 8/2002 | Yoshihisa | ..................... 438/202 |
| 6,630,377 B1 | * | 10/2003 | Panday et al. | ................. 438/202 |
| 6,646,311 B2 | * | 11/2003 | Chatterjee | ..................... 257/370 |
| 6,649,983 B2 | * | 11/2003 | Chatterjee | ..................... 257/370 |

(Continued)

FOREIGN PATENT DOCUMENTS

KR   10-1998-0012432   4/1998

*Primary Examiner* — Kimberly Rizkallah
*Assistant Examiner* — Alexander Belousov
(74) *Attorney, Agent, or Firm* — F. Chau & Associates, LLC

(57) ABSTRACT

A method for forming a bipolar junction transistor comprises forming a first well of a second conductive type for forming a collector region in a substrate including device isolation layers, wherein the substrate comprises a first conductive type, forming a second well of the first conductive type for a metal-oxide-semiconductor transistor of the second conductive type within the first well of the second conductive type, wherein the second well of the first conductive type is formed deeper than the device isolation layers, forming a shallow third well of the first conductive type for a base region within the first well of the second conductive type, wherein the shallow third well of the first conductive type is formed shallower than the device isolation layers, and simultaneously forming an emitter region within the shallow third well of the first conductive type and a plurality of collector contacts within the first well of the second conductive type by performing an ion implantation process for forming source/drain regions of the metal-oxide-semiconductor transistor of the second conductive type.

16 Claims, 12 Drawing Sheets

(56) References Cited

U.S. PATENT DOCUMENTS

| | | | |
|---|---|---|---|
| 6,667,202 B2 * | 12/2003 | Suzuki | 438/202 |
| 6,730,557 B2 * | 5/2004 | Arai | 438/234 |
| 6,737,721 B1 * | 5/2004 | Suzuki | 257/500 |
| 6,858,486 B2 * | 2/2005 | Chatterjee | 438/202 |
| 7,745,882 B2 * | 6/2010 | Kim | 257/370 |
| 2003/0062539 A1 * | 4/2003 | Chatterjee | 257/199 |
| 2003/0067012 A1 * | 4/2003 | Chatterjee | 257/197 |
| 2003/0102512 A1 * | 6/2003 | Chatterjee | 257/370 |
| 2004/0007713 A1 * | 1/2004 | Sakuragi | 257/189 |
| 2004/0046183 A1 * | 3/2004 | Chatterjee | 257/197 |
| 2004/0195586 A1 * | 10/2004 | Suzuki | 257/197 |
| 2006/0131693 A1 * | 6/2006 | Kim | 257/565 |
| 2009/0159984 A1 * | 6/2009 | Yoon | 257/378 |

\* cited by examiner

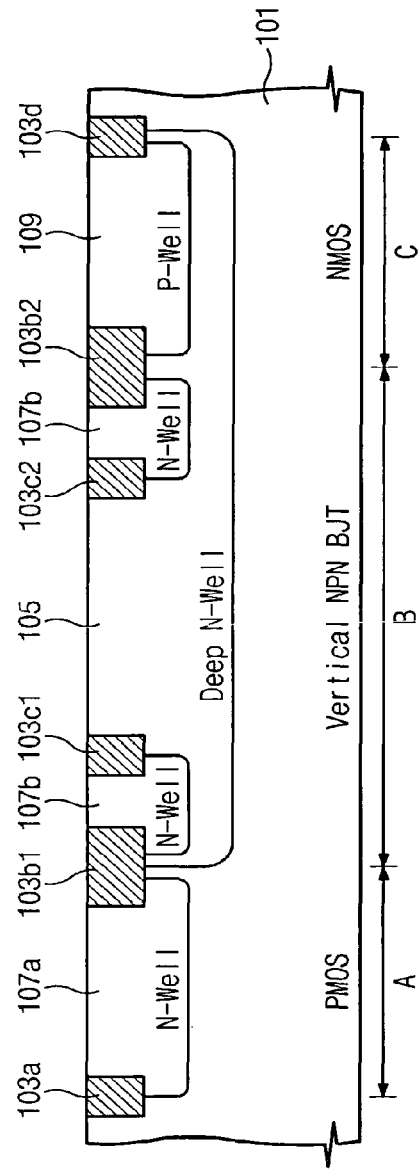
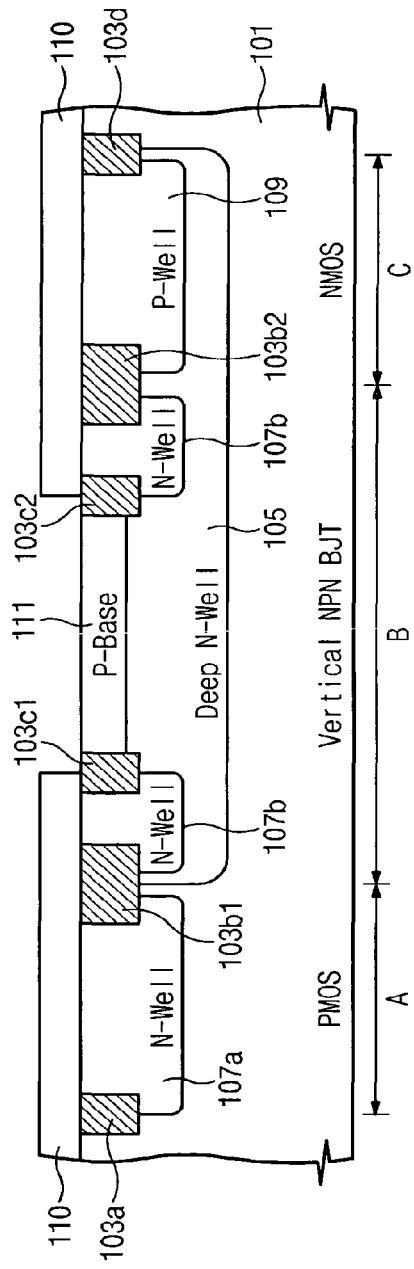

HIGH-GAIN BIPOLAR JUNCTION TRANSISTOR COMPATIBLE WITH COMPLEMENTARY METAL-OXIDE-SEMICONDUCTOR (CMOS) PROCESS AND METHOD FOR FABRICATING THE SAME

CROSS-REFERENCE TO RELATED APPLICATION

This application is a divisional of U.S. patent application Ser. No. 11/303,885 filed on Dec. 16, 2005, now U.S. Pat. No. 7,745,882, which claims priority to Korean Patent Application No. 2004-108013, filed on Dec. 17, 2004, the disclosure of which is incorporated herein in its entirety by reference.

BACKGROUND OF THE INVENTION

1. Technical Field

The present disclosure relates to a bipolar junction transistor and a method for fabricating the same; and more particularly, to a bipolar junction transistor that is compatible with a complementary metal-oxide semiconductor process and a method for fabricating the same.

2. Discussion of the Related Art

In complementary metal-oxide semiconductor (CMOS) technology, an n-type channel metal-oxide-semiconductor field effect transistor (MOSFET) and a p-type channel MOSFET are fabricated in proximity on the same chip. The CMOS technology has been used in various circuit application fields such as high-frequency circuits and high-frequency system-on-chip. The n-channel MOSFET and the p-channel MOSFET are referred to as an NMOS transistor and a PMOS transistor, respectively.

The CMOS devices do not provide a low noise characteristic required for devices configured for high-frequency circuits. The devices configured for high-frequency circuits include, for example, a low noise amplifier (LNA) and a voltage control oscillator (VCO). A bipolar junction transistor having a frequency response characteristic and current driving capability is fabricated on the same chip as the CMOS device. The high performance bipolar junction transistor is used for a high-frequency circuit, while the CMOS device is used for a logic circuit.

The bipolar junction transistor includes three terminals, that is, a base, an emitter and a collector. For the bipolar junction transistor fabrication, several mask processes and ion implantation processes are performed to form the three terminals with different depths in a substrate. Various methods have been used to incorporate a bipolar junction transistor with a standard CMOS process while maintaining characteristics of the bipolar junction transistor. Processes that fabricate the bipolar junction transistor and the CMOS device simultaneously have been developed.

According to one process, an ion implantation process for forming an n-well in which a PMOS transistor will be formed is performed to form a collector region. Ion implantation of arsenic (As) for forming lightly doped drain (LDD) regions of an NMOS transistor forms an emitter region and a collector buffer. A base region is formed through ion implantation of boron for forming LDD regions of the PMOS transistor. An emitter contact and a collector contact are formed by implanting a highly doped n+-type impurity for forming a source region and a drain region of the NMOS transistor. A base contact is formed through ion implantation of a highly doped p+-type impurity for forming a source region and a drain region of the PMOS transistor.

However, since the LDD ion implantation and a high doping level of the n-well ion implantation are applied to form the base region and the collector region, respectively, a large scale of the base width modulation occurs and the early voltage decreases. During the base width modulation, a depletion region between the base region and the collector region increases while the base width decreases. This large scale of the base width modulation impairs stability of the bipolar junction transistor. It is difficult to form the stable base region because of an extremely low doping level in the base region. In addition, the doping level in the base region, the width thereof and the doping level in the collector region are fixed to the CMOS process. Thus, the operation characteristics of the bipolar junction transistor and the CMOS device may not be satisfied simultaneously.

In another process, using a relatively deep n-well instead of using a well for a MOS transistor to improve a high-frequency operation characteristic and to reduce an incidence of noise coupling from a logic circuit to a high-frequency circuit has been suggested. According to this process, the deep n-well having a low doping level is to employed as a collector region, and an ion implantation process for forming a p-well in which an NMOS transistor will be formed is performed to form a base region. Another ion implantation process for forming an n-well region in which a PMOS transistor will be formed is performed to form a collector buffer. Ion implantation of a highly doped n+-type impurity for forming source/drain regions of the NMOS transistor forms an emitter region and a collector contact. A base contact is formed by ion-implanting a highly doped p+-type impurity for forming source/drain regions of the PMOS transistor.

However, since the base region is formed through the ion implantation process for forming the p-well region in which the NMOS transistor will be formed, the base width depends on the p-well process of the NMOS transistor. Therefore, the base region and the p-well have the same depth. The depth of the p-well for the NMOS transistor is far larger than the width of the base region required by the high-performance bipolar junction transistor. Herein, the width of the base region is a measurement of the effective base region in the perpendicular direction from an upper surface of a substrate. That is, the base width is substantially large. Hence, there exists a difficulty in satisfying the high-quality operation characteristic suitable for the high-frequency circuit as the transition time of carriers in the base region increases.

Another known method reduces a base width of a CMOS device through counter-doping. According to this method, an ion implantation process for forming a deep n-well is applied to form a collector region, and another ion implantation process for forming a p-well in which an NMOS transistor will be formed is used to define a boundary beneath the base region. The counter-doping is executed to a p-well region by performing an ion implantation process for forming an n-well in which a PMOS transistor will be formed for defining a boundary above the base region and an emitter region. The p-well is formed deeper than the n-well, and a base width is determined by a depth difference between these two wells.

In the CMOS process, the n-well and the p-well generally have substantially the same depth. Thus, it is difficult to adjust the base width through the n-type counter-doping. The emitter region subjected to the counter-doping has a high level of resistivity, thereby degrading performance of the bipolar junction transistor at a high-frequency region. Also, a gain value is low since a doping level of the emitter region is low.

Therefore, a need exists for a method for forming a bipolar junction transistor with high gain and high-performance while being compatible with the CMOS process.

SUMMARY OF THE INVENTION

Exemplary embodiments of the present invention disclose a high-gain bipolar junction transistor compatible with a complementary metal-oxide-semiconductor (CMOS) process and a method for fabricating the same.

According to an embodiment of the present invention, a method for forming a bipolar junction transistor comprises forming a first well of a second conductive type for forming a collector region in a substrate including device isolation layers, wherein the substrate comprises a first conductive type, forming a second well of a first conductive type for a metal-oxide-semiconductor transistor of the second conductive type within the first well of the second conductive type, wherein the second well of the first conductive type is formed deeper than the device isolation layers, forming a shallow third well of the first conductive type for a base region within the first well of the second conductive type, wherein the shallow third well of the first conductive type is formed shallower than the device isolation layers, and simultaneously forming an emitter region within the shallow third well of the first conductive type and a plurality of collector contacts within the first well of the second conductive type through performing an ion implantation process for forming source/drain regions of the metal-oxide-semiconductor transistor of the second conductive type.

According to another embodiment of the present invention, a method for forming a bipolar junction transistor comprises forming a collector region of a second conductive type in a substrate of a first conductive type including device isolation layers, forming a base region of a first conductive type by performing an ion implantation process separately from a process for forming a well of the first conductive type for a metal-oxide-semiconductor transistor of the second conductive type, and forming an emitter region of a second conductive type in the base region by performing an ion implantation process for forming source/drain regions of the metal-oxide-semiconductor transistor of the second conductive type.

According to another embodiment of the present invention, a semiconductor device comprises a first well of a second conductive type for a collector region of a bipolar junction transistor, the first well formed in a substrate of a first conductive type and isolated by device isolation layers, a plurality of second wells of the second conductive type being formed within the first well of the second conductive type and serving as a buffer for the collector region, a third well of the second conductive type for forming a metal-oxide-semiconductor transistor of the first conductive type, the third well formed in the substrate disposed outside the first well of the second conductive type and isolated from the first well of the second conductive type by the device isolation layers, a fourth well of the first conductive type for forming a metal-oxide-semiconductor transistor of the second conductive type, the fourth well formed within the first well of the second conductive type and isolated from the second wells of the second conductive type by the device isolation layers, a base region of the first conductive type formed within the first well of the second conductive type, isolated from the second wells of the second conductive type by the device isolation layers and shallower than the device isolation layers, an emitter region of the second conductive type formed within the base region, and the metal-oxide-semiconductor transistor of the second conductive type formed on the fourth well of the first conductive type and the metal-oxide-semiconductor transistor of the first conductive type formed on the third well of the second conductive type.

BRIEF DESCRIPTION OF THE DRAWINGS

Preferred embodiments of the present invention can be understood in more detail from the following description taken in conjunction with the accompanying drawings in which:

FIGS. 2 to 8 are cross-sectional views illustrating a method for fabricating a bipolar junction transistor compatible with a complementary metal-oxide-semiconductor (CMOS) process in accordance with an embodiment of the present invention;

DETAILED DESCRIPTION OF PREFERRED EMBODIMENTS

Preferred embodiments of the present invention will be described below in more detail with reference to the accompanying drawings. The present invention may be embodied in many different forms and should not be construed as limited to the embodiments set forth herein.

In a method for forming a bipolar junction transistor compatible with a complementary metal-oxide-semiconductor (CMOS) process, an NPN bipolar junction transistor is used for embodiments of the present invention. A PNP bipolar junction transistor can also be used by applying a reverse doping of impurity types.

Figure 1A:
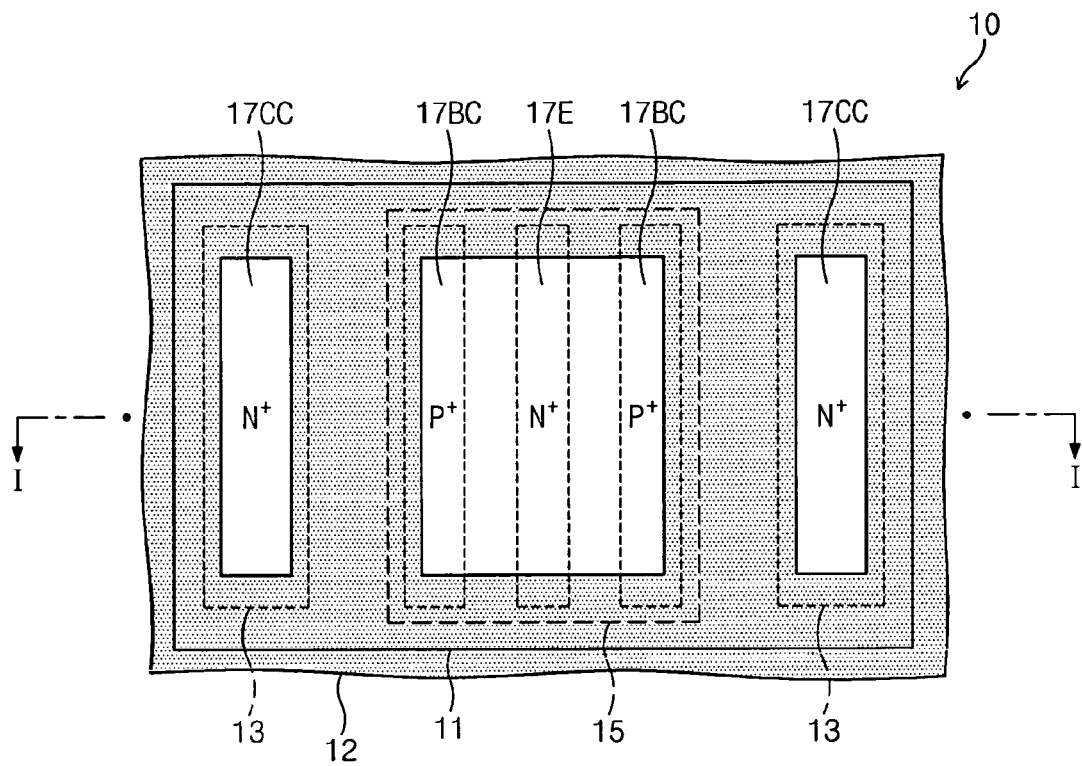
FIG. 1A is a top view showing a bipolar junction transistor in accordance with an embodiment of the present invention.
Figure 1B:
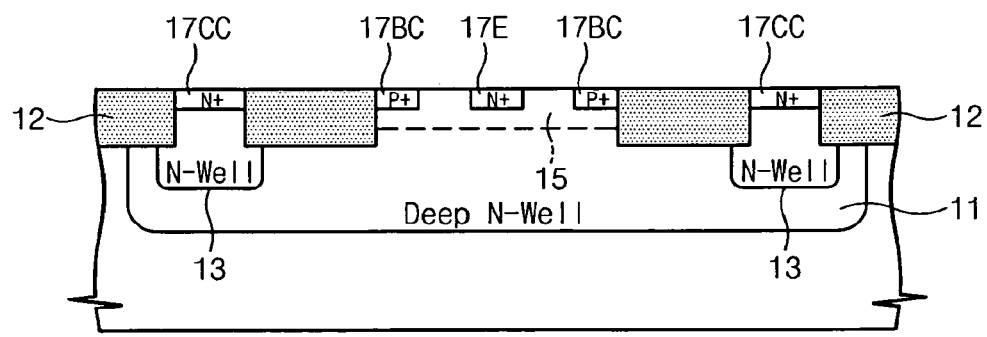
FIG. 1B is a cross-sectional view showing the bipolar junction transistor taken along the line I-I shown in FIG. 1A.

FIG. 1A is a top view showing an NPN bipolar junction transistor according to an embodiment of the present invention. FIG. 1B is a cross-sectional view showing the NPN bipolar junction transistor taken along the line I-I shown in FIG. 1A.

Referring to FIGS. 1A and 1B, the NPN bipolar junction transistor 10 includes a deep n-well 11 used as a collector region, a shallow p-well 15 used as a base region, and a highly doped n+-type impurity region 17E used as an emitter region formed in the shallow p-well 15. The deep n-well 11 used as the collector region includes a plurality of n-wells 13 serving as a collector buffer for decreasing a resistance of the collector region. The shallow p-well 15 used as the base region is formed shallower than the n-wells 13. A plurality of highly doped n-type impurity regions 17CC used as collector contacts are disposed in the corresponding n-wells 13, and a plurality of highly doped p+-type impurity regions 17BC used as base contacts are disposed in the shallow p-well 15.

A device isolation layer 12 isolates the highly doped n-type impurity regions 17CC and the highly doped p+-type impurity regions 17BC from each other. The highly doped p+-type impurity regions 17BC and the emitter region 17E are not isolated by the device isolation layer 12 but are isolated electrically by being allocated apart from each other. The shallow p-well 15 for the base region is formed shallower than the device isolation layer 12 and has a doping level lower than that of a p-well for an NMOS transistor in a CMOS process. A process for forming the shallow p-well 15 for the base region is applied separately from a p-well process of the CMOS process. Therefore, a width of the base region dependent on ion implantation energy and a doping level dependent on an ion implantation dose can have optimum values regardless of the CMOS process.

A doping level of the deep n-well 11 used as the collector region is lower than that of the n-well 13 used as the collector buffer. Since the deep n-well 11 is formed separately from a p-well or n-well formation process of the CMOS process, the doping level can be adjusted according to a device characteristic. This doping level adjustment of the deep n-well 11 improves a high-frequency operation characteristic and decreases noise coupling from a logic circuit to a high-frequency circuit.

According to an embodiment of the present invention, for achieving a contact with a low level of resistance, a silicide layer can be formed on the highly doped p+-type impurity regions 17BC used as the base contacts, the highly doped n+-type impurity region 17E and the highly doped n-type impurity regions 17CC used as the collector contacts. According to another embodiment of the present invention, an anti-silicide formation layer can be formed on portions of the shallow p-well 15 each disposed between the highly doped p+-type impurity region 17BC and the highly doped n+-type impurity region 17E for preventing formation of the silicide layer. The highly doped p+-type impurity region 17BC and the highly doped n+-type impurity region 17E are alternately isolated from each other.

With reference to FIGS. 2 to 8, a method for forming a bipolar junction transistor compatible with a CMOS process in accordance with an embodiment of the present invention is described. In FIGS. 2 to 8, reference notations A, B and C represent a region where a PMOS transistor is formed, a vertical NPN bipolar transistor is formed and an NMOS transistor is formed, respectively. The NPN bipolar junction transistor according to an embodiment of the present invention includes two base contacts and two collector contacts.

Referring to FIG. 2, a substrate 101 is prepared to form the bipolar junction transistor compatible with the CMOS process. For instance, the substrate 101 is a wafer cut from Czochralski based single-crystal bulk silicon or Float Zone. The substrate 101 can be a substrate including at least more than one epitaxial layer, a buried oxide layer and a doping region. The substrate 101 is a substrate of a first conductive type, for instance, a p-type including an impurity such as boron.

Then, a device isolation process is performed to form first to sixth device isolation layers 103a, 103b1, 103b2, 103c1, 103c2, and 103d, which electrically isolate and define regions where devices will be formed. The regions include the bipolar junction transistor (BJT) region, the PMOS region A and the NMOS region C. The device isolation process can employ a known shallow trench isolation method. For example, the known shallow trench isolation method forms trenches by etching predetermined regions of the substrate where device isolation layers will be formed, and fills an insulation material into the trenches and then applies a planarization process on the insulation material.

In an embodiment of the present invention, the second device isolation layer 103b1 electrically isolates the PMOS region A and the BJT region B from each other. The third device isolation layer 103b2 electrically isolates the BJT region B and the NMOS region C from each other. The fourth device isolation layer 103c1 and the fifth device isolation layer 103c2 formed within the BJT region B electrically isolate base contacts from collector contacts.

Subsequently, a second conductive type impurity is selectively implanted into the BJT region B and the NMOS region C. A thermal annealing process is applied thereto to form a deep n-well 105 which will be used as a collector region. An ion implantation shielding mask shields the PMOS region A from the ion implantation of the second conductive type impurity. The ion implantation for forming the deep n-well 105 is performed by using a dose of phosphorus (P) ranging from approximately $4 \times 10^{12}$ cm$^{-2}$ to approximately $4 \times 10^{13}$ cm$^{-2}$ and ion implantation energy ranging from approximately 600 KeV to approximately 1,200 KeV. Thus, according to an embodiment of the present invention, the deep n-well 105 has a doping level of approximately $1 \times 10^{16}$ cm$^{-3}$ at a junction between the base region and the collector region.

According to an embodiment of the present invention, this doping level of the deep n-well 105 is lower than those of wells for forming the PMOS and NMOS transistors. That is, since the doping level of the deep n-well 105 for the collector region can be achieved separately from the CMOS process, the collector region can be formed in an optimum condition for the device operation.

A p-well 109 in which the NMOS transistor will be formed is formed within the deep n-well 105. Thus, the high-frequency operation characteristic can be improved and the noise coupling from the logic circuit to the high-frequency circuit can be decreased.

Next, a first n-well 107a for the PMOS transistor and the p-well 109 for the NMOS transistor are formed. The first n-well 107a can be formed prior to the formation of the p-well 109 or vice versa. During the formation of the first n-well 107a for the PMOS transistor, a plurality of second n-wells 107b for collector buffers can be formed in the deep n-well 105. The second n-wells 107b can be used to decrease the resistance of the collector region.

The first n-well 107a for the PMOS transistor and the second n-wells 107b used as the collector buffers are formed through implanting approximately $2.2 \times 10^{13}$ cm$^{-2}$ of the second conductive type impurity using the ion implantation energy of approximately 170 KeV. The second conductive type impurity can be an n type impurity such as phosphorus (P). The first n-well 107a for the PMOS transistor is formed in the PMOS region A of the substrate 101. The second n-wells 107b used as the collector buffers are formed in the deep n-well 105 in the BJT region B. The second n-wells 107b are formed between the second device isolation layer 103b1 and the fourth device isolation layer 103c1, and formed between the third device isolation layer 103b2 and the fifth device isolation layer 103c2. According to an embodiment of the present invention, an ion implantation shield mask is used to prevent the n-type impurity from being implanted into the NMOS region C.

The p-well 109 for the NMOS transistor is formed in the NMOS region C defined within the deep n-well 105 through implanting approximately $2.5 \times 10^{-13}$ cm$^{-2}$ of the p-type impurity such as boron (B) using the implantation energy of approximately 170 KeV. According to an embodiment of the present invention, an ion implantation shield mask can be used to shield the PMOS region A and the BJT region B to prevent the regions A and B from being implanted with the p-type impurity.

Referring to FIG. 3, the BJT region B is subjected to a selective ion implantation of the p-type impurity to form a shallow p-well 111 used as a base region. The PMOS region A and the NMOS region C are masked by a first ion implantation shield mask 110 that is used to prevent the p-type impurity from being implanted thereinto.

According to an embodiment of the present invention, the first ion implantation shield mask 110 can be formed by using photoresist. The ion implantation process for forming the shallow p-well 111 implants approximately $2 \times 10^{13}$ cm$^{-2}$ to approximately $5 \times 10^{13}$ cm$^{-2}$ of boron into the deep n-well 105 by using the implantation energy of approximately 20 KeV to approximately 30 KeV. Through this ion implantation process, the shallow well 111 has a depth of approximately 250 nm and an expected peak doping level of approximately $1 \times 10^{18}$ cm$^{-3}$. Since this ion implantation process for forming the shallow p-well 111 is performed separately from the CMOS process for forming the first n-well 107a and the p-well 109, the doping level and the depth of the shallow p-well 111 can be adjusted to exhibit optimum characteristics without being affected by the well formation process of the CMOS process.

Sequentially, as shown in FIGS. 4 to 7, the CMOS process is applied to form the NMOS transistor 125 on the p-well 109 of the NMOS region C and is applied to form the PMOS transistor 137 on the first n-well 107a of the PMOS region A. In an embodiment of the present invention, a first ion implantation process 121 for forming source/drain regions 123S/D of the NMOS transistor 125 results in simultaneous formation of an emitter region 123E and collector contacts 123CC. A second ion implantation process 133 for forming source/drain regions 135S/D of the PMOS transistor 137 results in formation of base contacts 135BC. To decrease a channel effect, the NMOS transistor 125 can have a pair of lowly doped drain regions (LDD) 117, and the PMOS transistor 137 can have a pair of LDD regions 127 as well.

Figure 4:
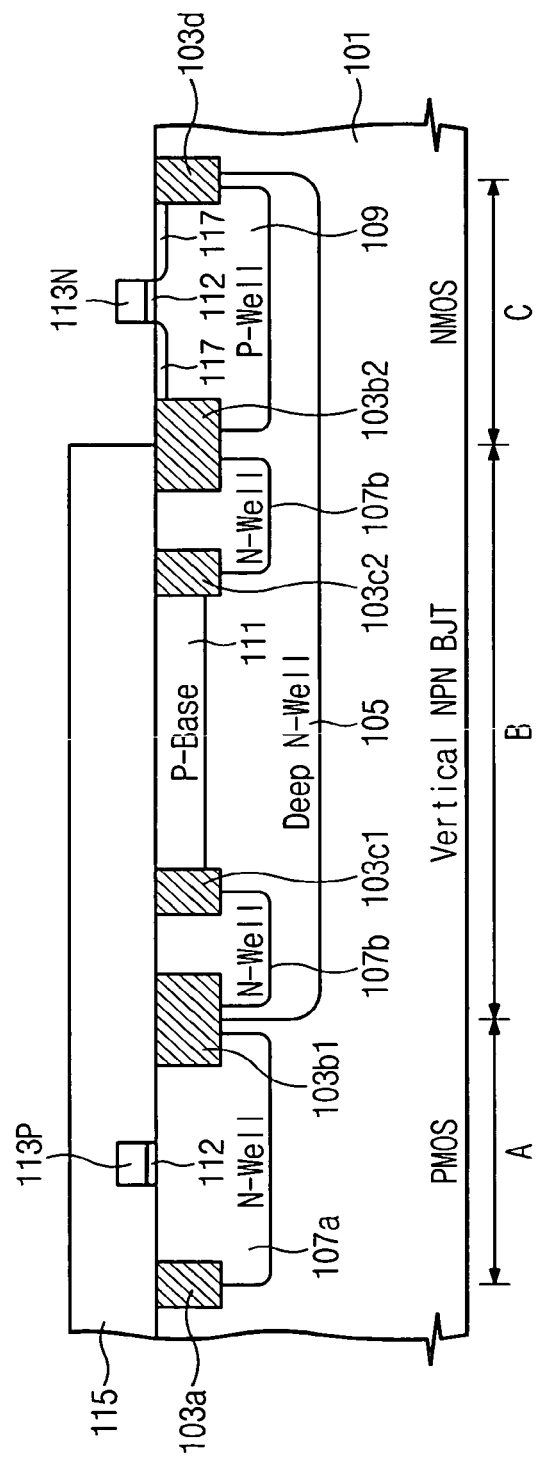

As shown in FIG. 4, a gate oxide layer 112 is formed. The gate oxide layer 112 can be a thermal oxide layer that is obtained through a thermal oxidation process. Then, a layer for use in a gate electrode is formed on the gate oxide layer 112 and patterned to form a gate electrode 113N for the NMOS transistor (NMOS gate electrode) and a gate electrode 113P for the PMOS transistor (PMOS gate electrode) in the NMOS region C and the PMOS region A, respectively. The NMOS gate electrode 113N and the PMOS gate electrode 113P comprise, for example, polysilicon, polysilicide, silicide and a combination thereof.

Subsequently, a second ion implantation shield mask 115 for use in a LDD region exposing the NMOS region C is formed. Then, a lowly doped n-type impurity is implanted to form the LDD regions 117 of the NMOS transistor 125 in the p-well 109 disposed beneath both lateral sides of the NMOS gate electrode 113N. In an embodiment of the present invention, the second ion implantation shield mask 115 can expose the second n-wells 107b and a region where the emitter will be formed.

Figure 5:
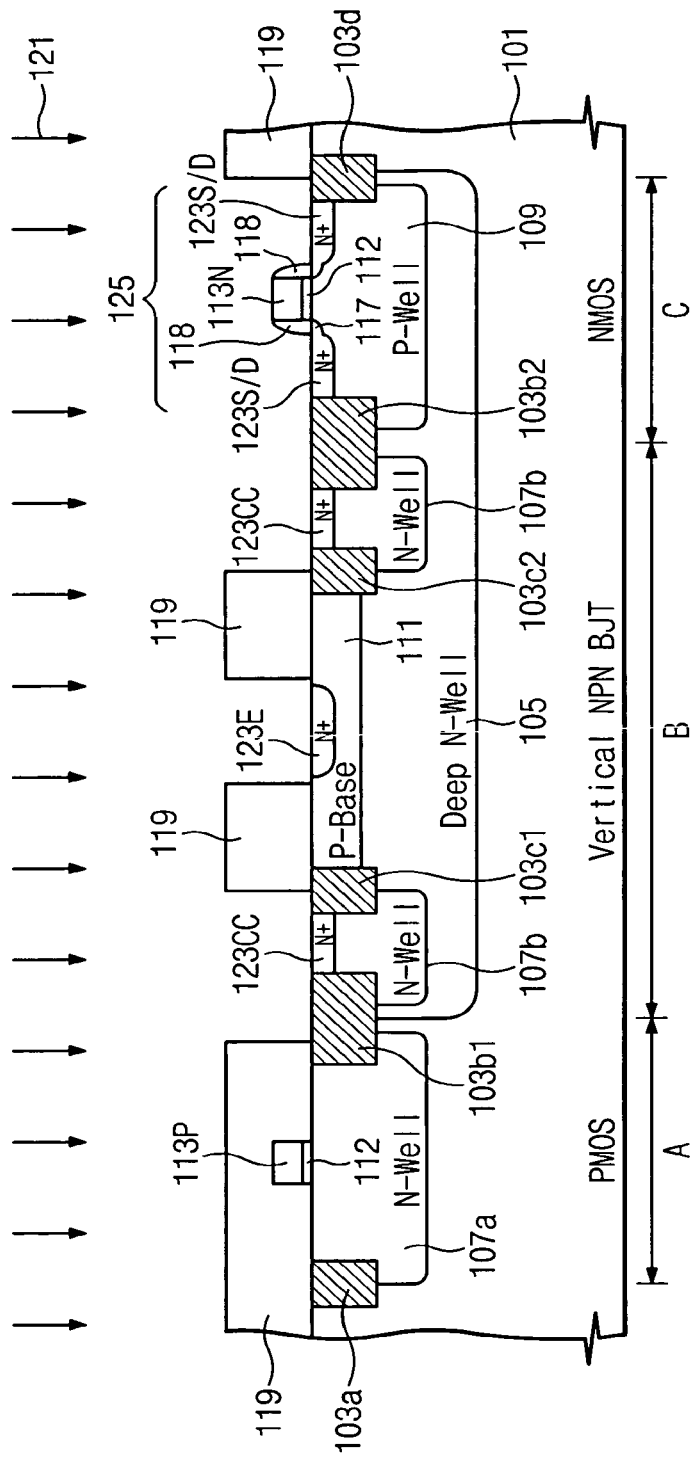

Referring to FIG. 5, a pair of gate spacers 118 is formed on sidewalls of the NMOS gate electrode 113N, and a third ion implantation shield mask 119 for obtaining the source/drain regions 123S/D, the emitter region 123E and the collector contacts 123CC is formed. The third ion implantation shield mask 119 masks the PMOS region A and a region where the base contacts will be formed. That is, the third ion implantation shield mask 119 exposes the NMOS region C, the second n-wells 107b used as the collector buffers and a portion of the shallow p-well 111 where the emitter will be formed. Through the first ion implantation process 121, a high concentration of an n-type impurity is implanted to form the source/drain regions 123S/D for the NMOS transistor, the emitter region 123E and the collector contacts 123CC. The source/drain regions 123S/D for the NMOS transistor are formed in portions of the p-well 109 disposed beneath lateral sides of the gate spacers 118. In an embodiment of the present invention, the emitter region 123E is formed at the center of the shallow p-well 111, which is a base region. The collector contacts 123CC are individually formed in the second n-wells 107b used as collector buffers.

The first ion implantation process 121 for the NMOS transistor 125 is performed by using the highly doped n+-type impurity such as arsenic (As) with the application of implantation energy ranging from approximately 40 KeV to approximately 50 KeV. A dose of the highly doped n+-type impurity ranges from approximately $5 \times 10^{15}$ cm$^{-2}$ to approximately $8 \times 10^{15}$ cm$^{-2}$. As a result of the first ion implantation process 121, the emitter region 123E, the collector contacts 123CC and the source/drain regions 123S/D of the NMOS transistor 125 can have a doping level ranging from approximately $1 \times 10^{20}$ cm$^{-3}$ to approximately $1 \times 10^{21}$ cm$^{-3}$.

Figure 6:
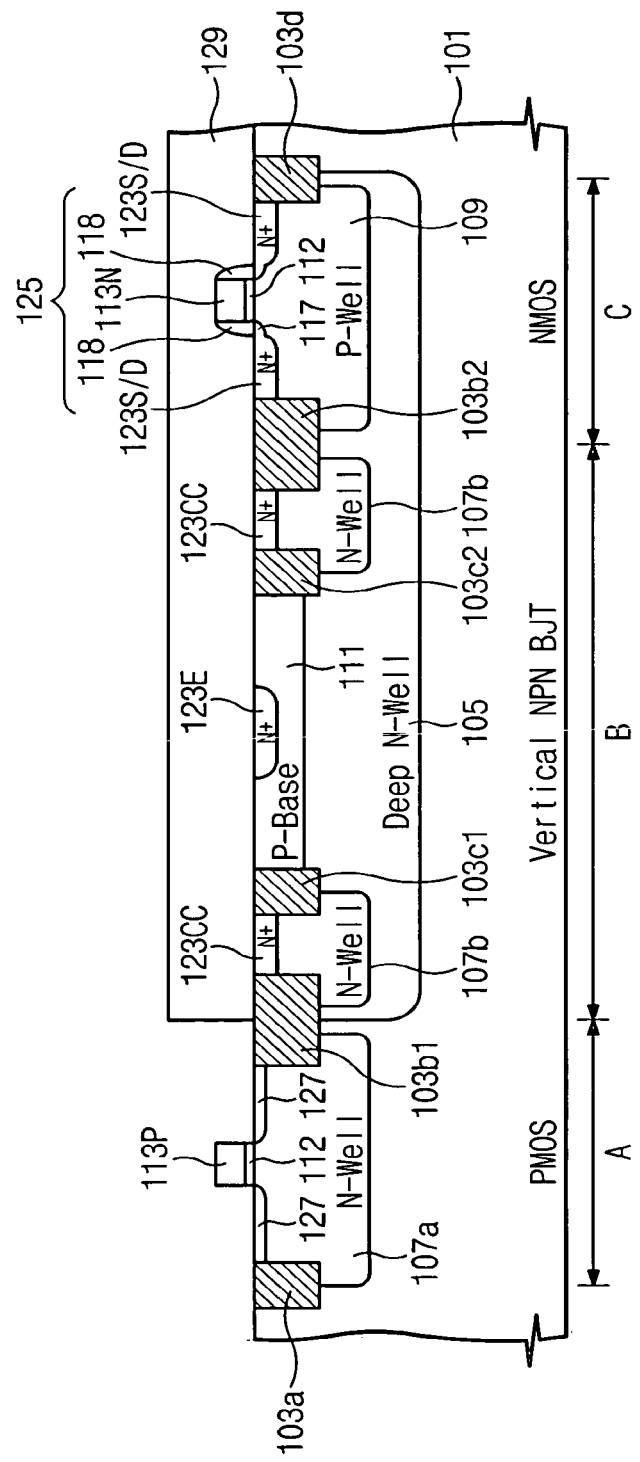

Referring to FIG. 6, a fourth ion implantation shield mask 129 for use in an LDD region is formed. The fourth ion implantation shield mask 129 exposes the PMOS region A and masks the BJT region B and the NMOS region C. A low concentration of a p-type impurity is then implanted to form the pair of LDD regions 127 of the PMOS transistor in the first n-well 107a disposed beneath both lateral sides of the PMOS gate electrode 113P. The fourth ion implantation shield mask 129 can further expose regions where the base contacts will be formed.

Figure 7:
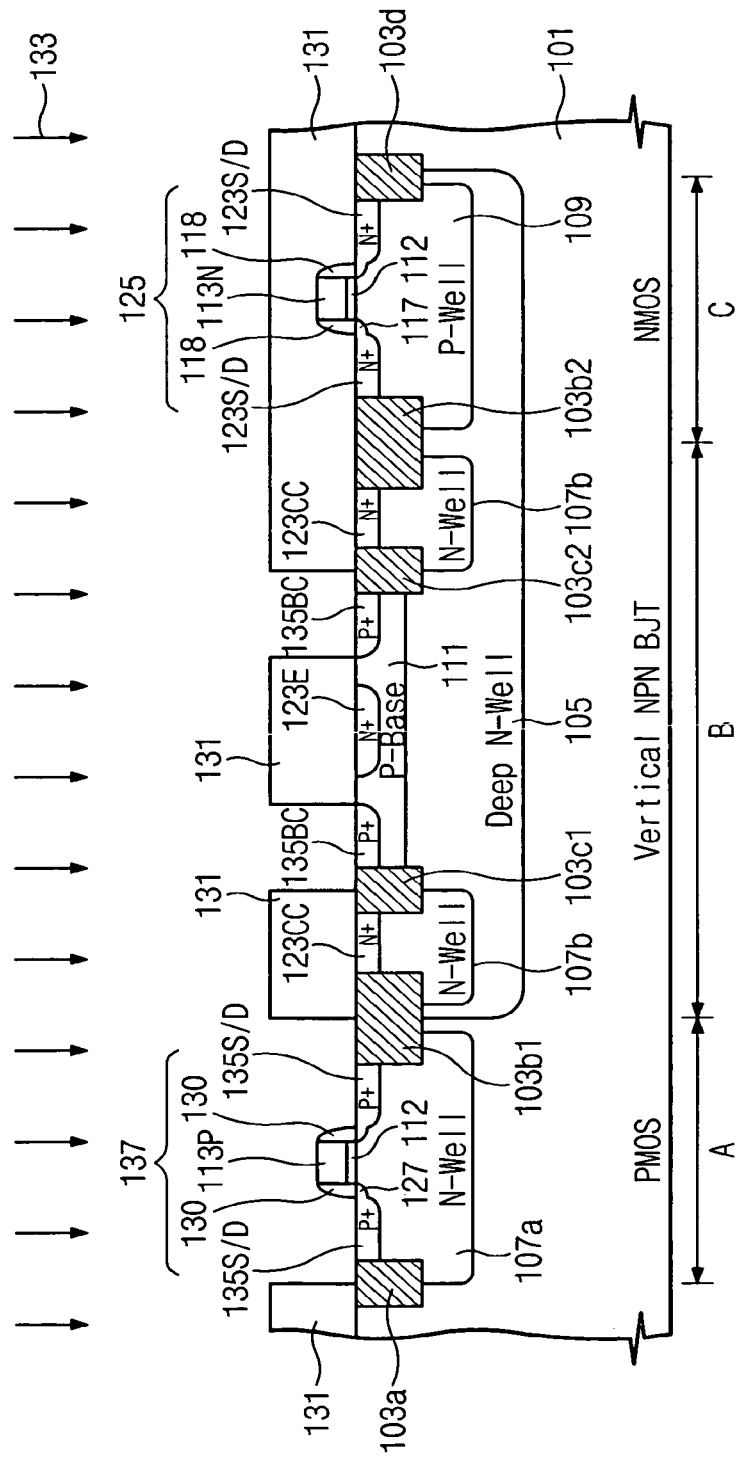

Referring to FIG. 7, a pair of gate spacers 130 are formed on both sidewalls of the PMOS gate electrode 113P. Then, a fifth ion implantation shield mask 131 for the source/drain regions 135S/D of the PMOS transistor 137 and the base contacts 135BC is formed. The fifth ion implantation shield mask 131 exposes the PMOS region A and portions of the shallow p-well 111 where the base contacts 135BC are formed. The fifth ion implantation shield mask 131 masks the regions where the collector contacts 123CC are formed, the emitter region 123E and the NMOS region C.

The second ion implantation process 133 uses a high concentration of a p-type impurity such as boron (B) to form the source/drain regions 135S/D and the base contacts 135BC. In an embodiment of the present invention, a dose of the p-type impurity is approximately $3 \times 10^{15}$ cm$^{-2}$ and approximately 5 KeV of the ion implantation energy is used. The source/drain regions 135S/D of the PMOS transistor 137 is formed in portions of the first n-well 107a disposed beneath both lateral sides of the spacers 130, and the base contacts 135BC are formed at both sides of the emitter region 123E being apart from the emitter region 123E.

Figure 8:
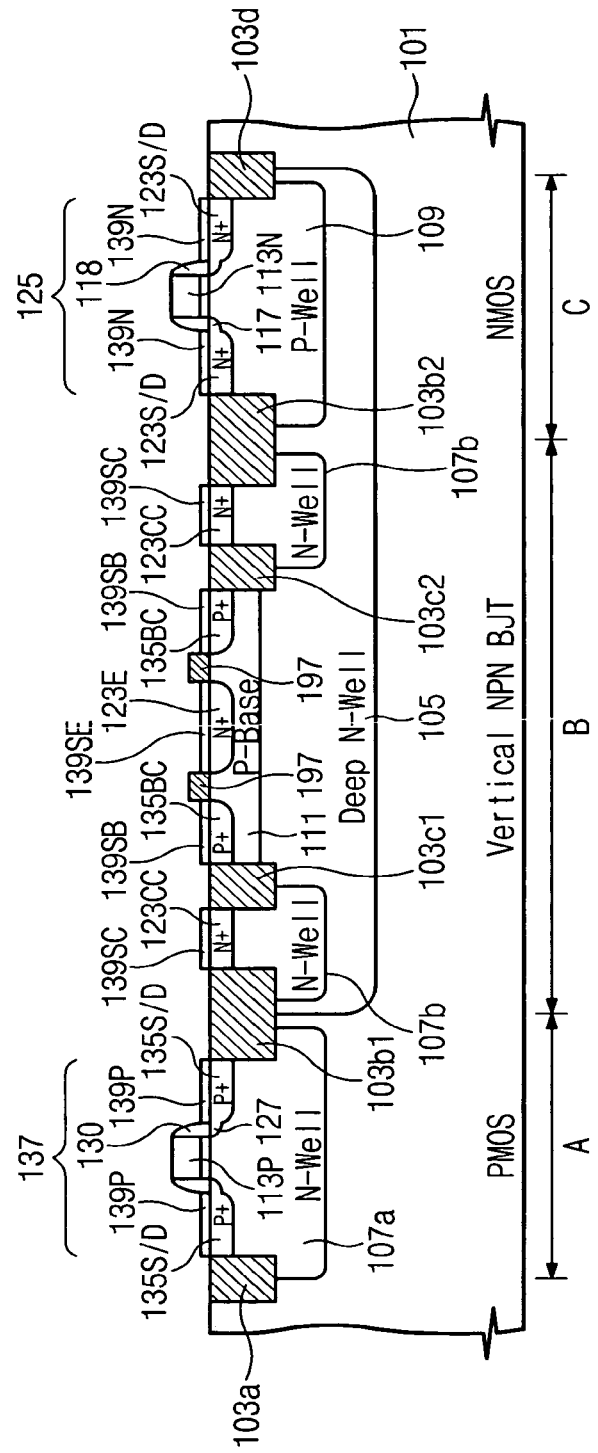

Referring to FIG. 8, to reduce a contact resistance, a pair of first silicide layers 139SB, a second silicide layer 139SE and a pair of third silicide layers 139SC are formed on the base contacts 135BC, the emitter region 123E and the collector contacts 123CC, respectively. A pair of fourth silicide layers 139P are formed on the source/drain regions 135S/D of the PMOS transistor 137 and a pair of fifth silicide layers 139N are formed on the source/drain regions 123S/D of the NMOS transistor 125. Anti-silicide formation layers 197 for preventing silicide formation are formed on portions of the shallow p-well 111 used as the base region. Each of the anti-silicide formation layers 197 is disposed between the individual base contact 135BC and the emitter region 123E. That is, after the anti-silicide formation layers 197 are formed, a known silicide formation process is performed to form the pair of first silicide layers 139SB, the second silicide layer 139SE and the pair of third silicide layers 139SC.

In an embodiment of the present invention, the shallow p-well 111 used as the base region can be formed prior to the formation of the first n-well 107a and the second n-wells 107b. The shallow p-well 111 can be formed between the first n-well 107a and the p-well 109 or between the second n-well 107b and the p-well 109. In an embodiment of the present invention, the p-well 109 is formed in the deep n-well 105. Alternatively, the p-well 109 can be formed in a portion of the substrate 101 disposed outside the deep n-well 105. The LDD process and the highly doped source/drain process for the PMOS transistor 137 can be performed before the LDD process and the highly doped source/drain process for the NMOS transistor 125. The device isolation layers (103a, 103b1, 103c1, 103c2, 103b2 and 103d) can electrically isolate the collector region, i.e., the deep n-well 105 from the base contacts 135BC. A dummy gate can be formed additionally on a portion of the base region, i.e., the shallow p-well 111 disposed between the deep n-well 105 and the individual base contact 135BC when the NMOS and CMOS transistors are formed.

Figure 9:
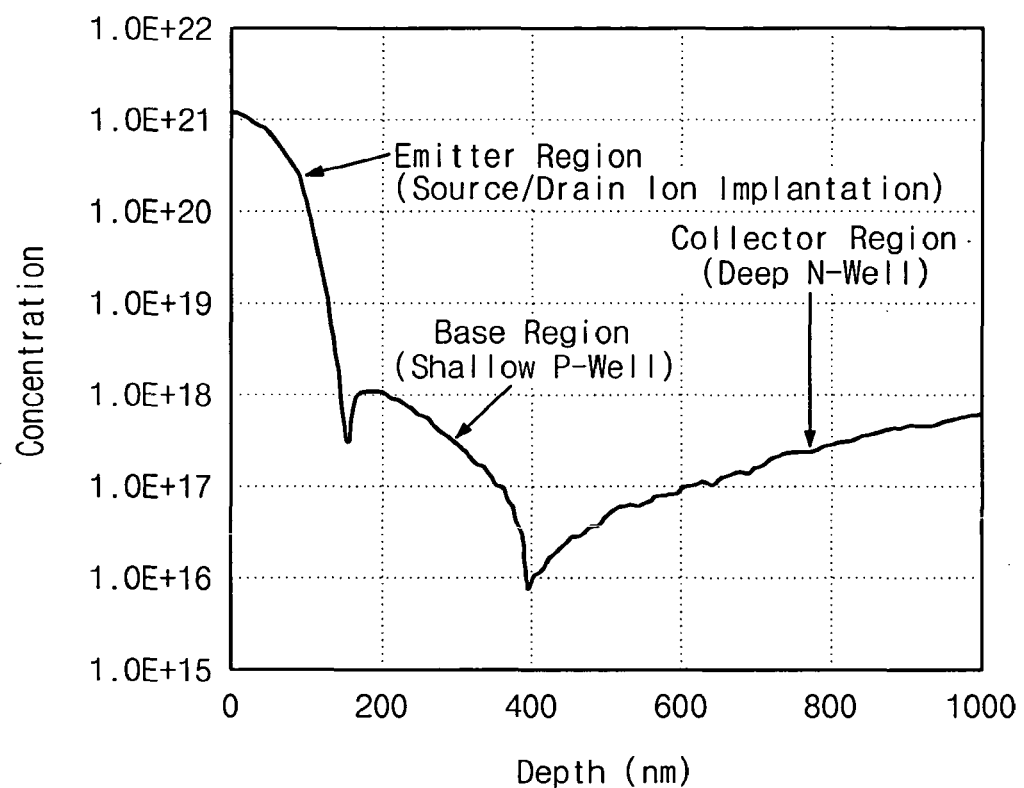
FIG. 9 is a graph showing a doping profile of a bipolar junction transistor in accordance with an embodiment of the present invention.

A description of a doping profile of a bipolar junction transistor according to an embodiment of the present invention is provided with reference to FIG. 9.

FIG. 9 is a graph showing impurity doping levels of an emitter region obtained through an ion implantation process for forming highly doped source/drain regions, a base region and a collector region in accordance with an embodiment of the present invention. A horizontal axis and a vertical axis in the graph represent a depth from a substrate surface measured in nanometers (nm) and an impurity concentration measured in the unit of $cm^{-3}$, respectively.

Since a shallow p-well formation process for forming the base region is performed separately from a well formation process, for example, the p-well formation process of the CMOS process, a concentration and a depth of the shallow p-well can be adjusted to result in a desired device characteristic. According to an embodiment of the present invention, the base region can have a depth of approximately 250 nm and a peak doping level of approximately $1.0 \times 10^{18}$ $cm^{-3}$.

Figure 10:
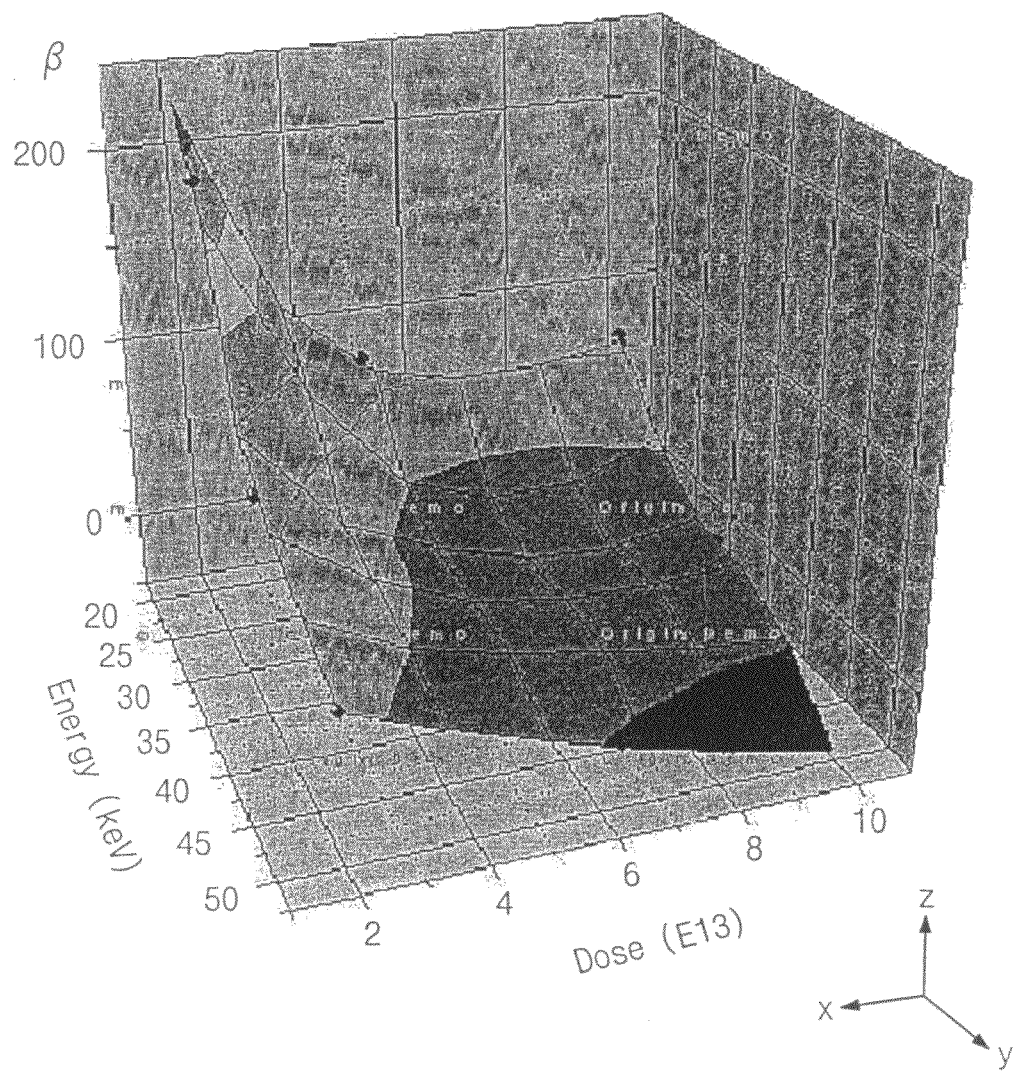
FIG. 10 is a graph showing beta values with respect to an ion implantation energy level and an impurity ion concentration for forming a base region in accordance with an embodiment of the present invention.

A description of parameters of an ion implantation process for forming a base region according to an embodiment of the present invention is provided with reference to FIG. 10.

FIG. 10 is a graph showing a relationship between an ion implantation energy level for forming a base region and beta (β) values with respect to a concentration of impurity ions. An x-axis, a y-axis and a z-axis represent the dose of impurity ions in the exponential of $10^{13}$, the ion implantation energy measured in KeV and the beta value, respectively.

The beta value increases as the ion implantation energy and the dose decrease. The determination of the beta value required for the bipolar junction transistor is related to the corresponding ion implantation energy level and dose to be determined.

A direct current characteristic and a high-frequency characteristic of the bipolar junction transistor are explained with reference to FIGS. 11A to 11C and FIG. 12.

According to an experimental determination for the direct current characteristic of the bipolar junction transistor, a collector region of the bipolar junction transistor is formed by implanting approximately $4.0 \times 10^{13}$ $cm^{-2}$ of phosphorus along with approximately 1,200 KeV of implantation energy. For a base region, approximately $5 \times 10^{13}$ $cm^{-2}$ of impurity ions are implanted with approximately 25 KeV of implantation energy. A collector region is formed through an ion implantation of arsenic with a dose of approximately $5.0 \times 10^{-15}$ $cm^{-2}$ and implantation energy of approximately 50 KeV.

Figure 11A:
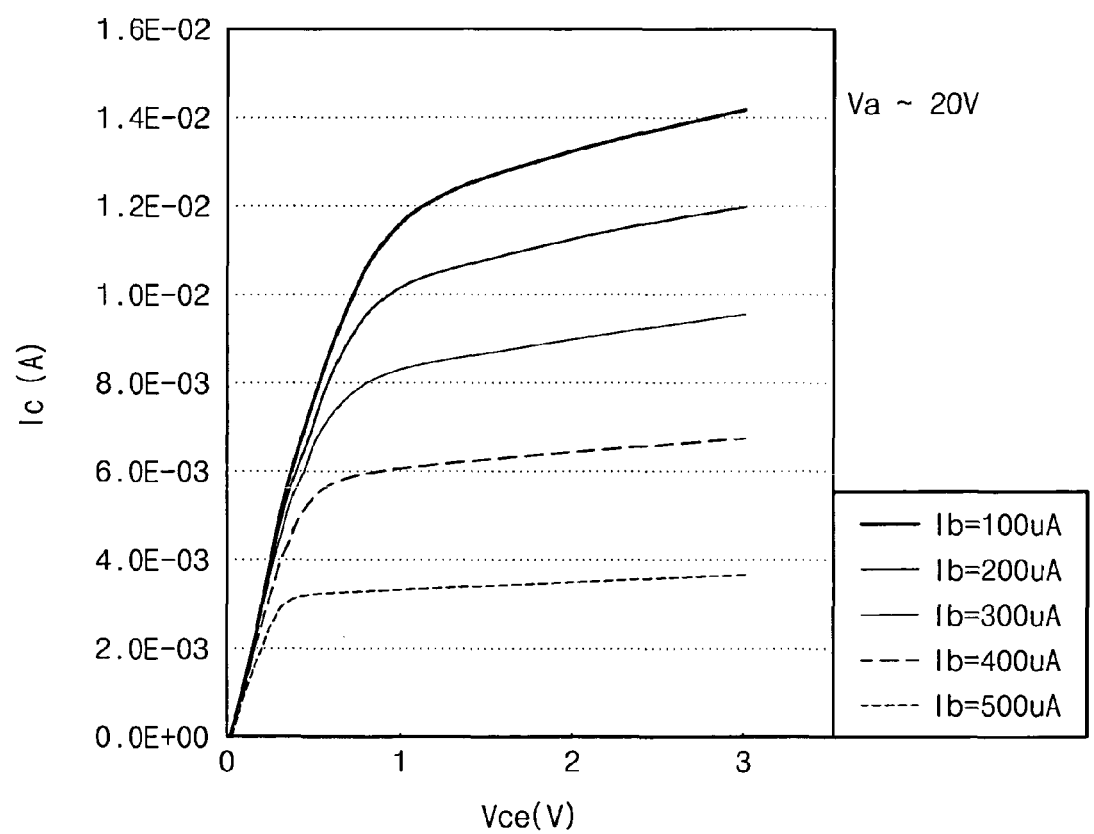
FIG. 11A is a graph showing a relationship between a collector-emitter voltage of a bipolar junction transistor and a collector current in accordance with an embodiment of the present invention.
Figure 11B:
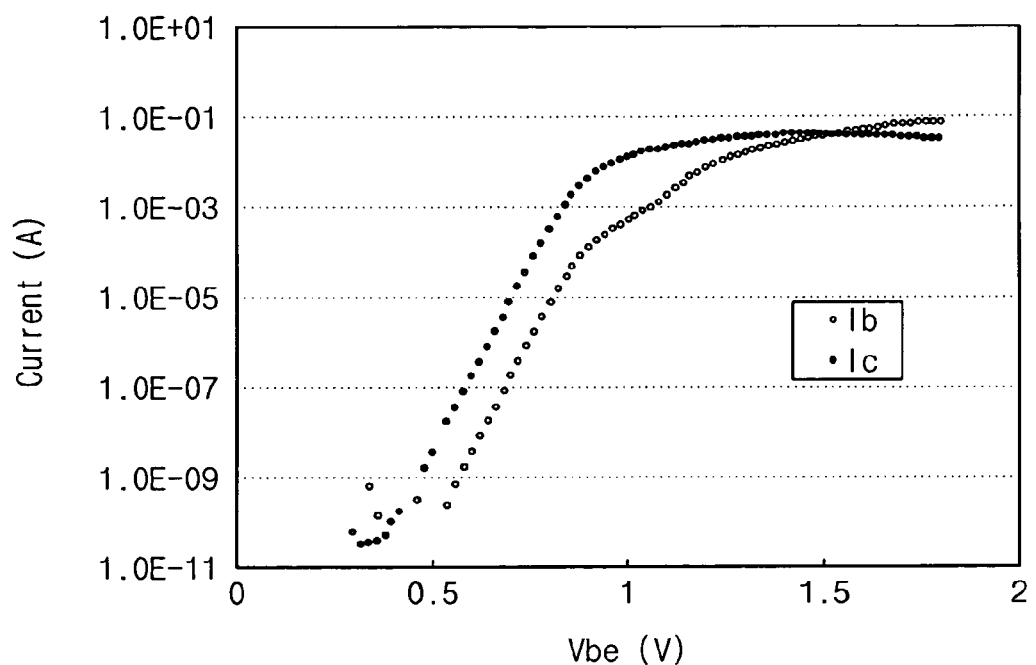
FIG. 11B is a graph showing a relationship between a base-emitter voltage of a bipolar junction transistor and a base current in accordance with an embodiment of the present invention.
Figure 11C:
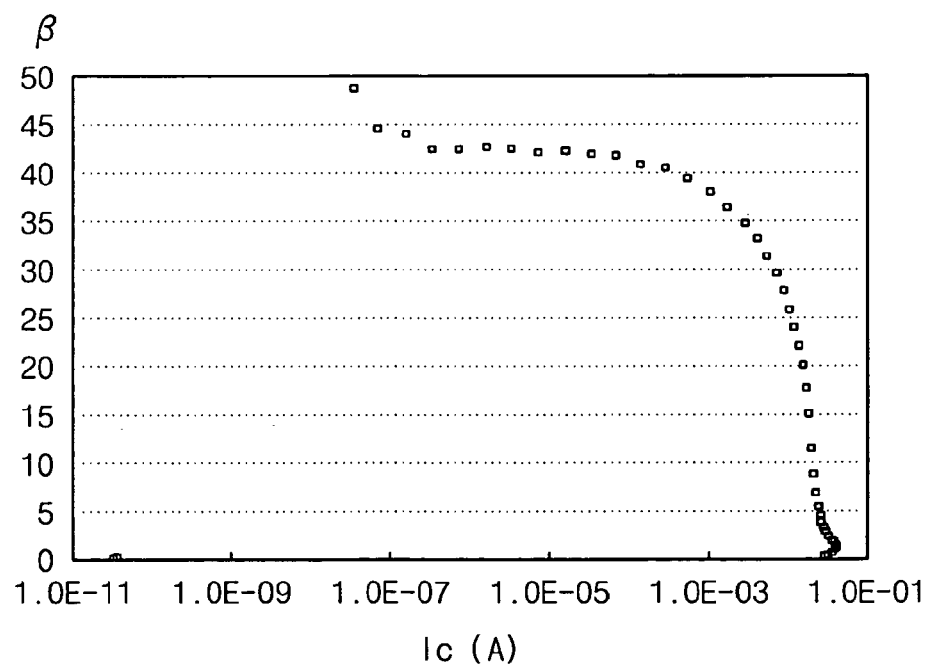
FIG. 11C is a graph showing a relationship between a collector current of a bipolar junction transistor and a beta ($\beta$) value in accordance with an embodiment of the present invention.

FIG. 11A is a graph showing a relationship between a collector-emitter voltage (Vce) and a collector current (Ic) in a bipolar junction transistor. FIG. 11B is a graph showing characteristics of a collection current (Ic) and a base current (Ib) with respect to a base-emitter voltage (Vbe). FIG. 11C is a graph showing a beta value, which is a ratio of the collector current (Ic) to the base current (Ib).

Referring to FIG. 11A, if the base current (Ib) is approximately 100 µA, the early voltage (Va) is approximately 20 V. In FIG. 11B, the collector-emitter voltage (Vice) is fixed at approximately 1.8 V. As shown in FIGS. 11A through 11C, the beta value is increased to approximately 42.

The collector-emitter breakdown voltage (BVceo) and the collector-base breakdown voltage (BVcbo) are approximately 6.25 V and approximately 19.65 V, respectively and these values are within an allowable range for the bipolar junction transistor.

To examine the frequency characteristic of the bipolar junction transistor used for the direct current characteristic analysis, a cut-off frequency (fT) and a maximum frequency of oscillation (fMAX) are measured under various bias conditions. For example, the cut-off frequency (fT) is a frequency where a current gain becomes approximately 1, and the maximum frequency of oscillation (fMAX) is a frequency where a power gain becomes approximately 1. For the above measurement, approximately 1.8 V of the collector-emitter voltage (Vice) is applied while the base-emitter voltage (Vbe) changes.

Figure 12:
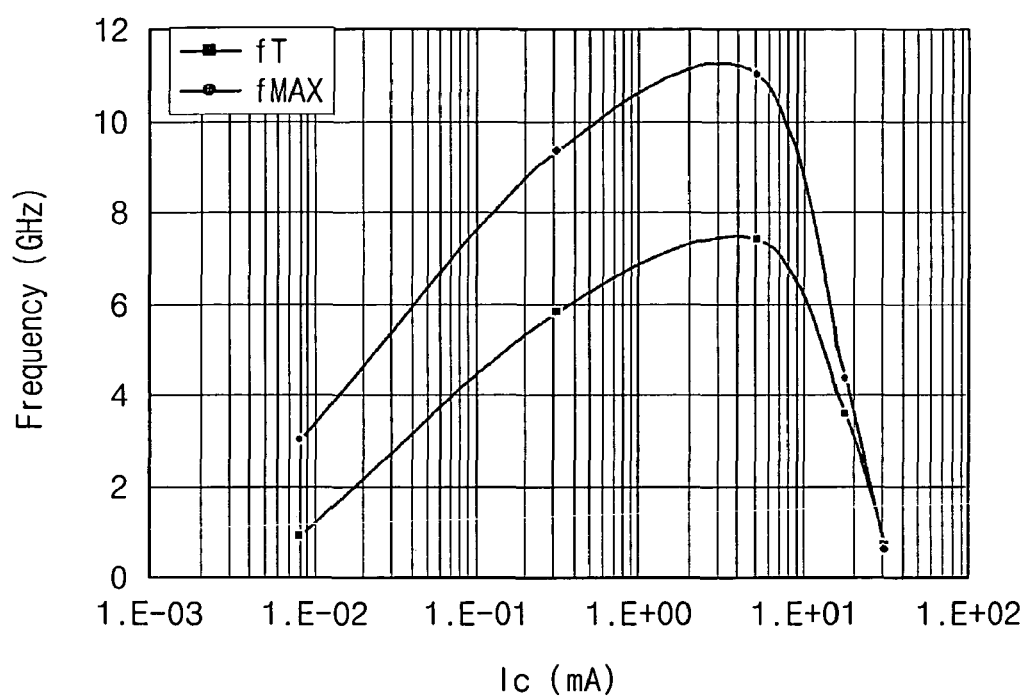
FIG. 12 is a graph showing a cut-off frequency (fT) and a maximum frequency of oscillation (fMAX) with respect to a bipolar junction transistor under various bias conditions in accordance with an embodiment of the present invention.

FIG. 12 and Table 1 provided below show the results of the above measurement.

TABLE 1

| Vbe (V) | Ic (collector current) | fT (GHz) | fMAX (GHz) |
|---|---|---|---|
| 0.7 | 0.0080 | 0.92 | 3.01 |
| 0.8 | 0.317 | 5.82 | 9.34 |
| 0.9 | 5.22 | 7.39 | 11.03 |
| 1.0 | 18.01 | 3.57 | 4.35 |
| 1.1 | 31.07 | 0.74 | 0.61 |
| 1.2 | 44.25 | — | — |
| 1.3 | 55.29 | — | — |

As shown above, the cut-off frequency (fT) of the bipolar junction transistor increases up to approximately 7.5 GHz, while the maximum frequency (fMAX) of oscillation increases up to approximately 11 GHz.

In accordance with embodiments of the present invention, the implantation energy and concentration for the ion implantation process for forming the base region can be applied separately from the CMOS process. Thus, the width and doping level of the base region that are optimum to the device characteristics can be obtained. Accordingly, a high performance and high gain bipolar junction transistor can be obtained along with the optimum characteristic for a high frequency circuit.

Although preferred embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A method for forming a bipolar junction transistor, the method comprising:
   forming a first well of a second conductive type for forming a collector region in a substrate including a device isolation layer, wherein the substrate comprises a first conductive type;
   forming a second well of the first conductive type for a metal-oxide-semiconductor transistor of the second conductive type within the first well of the second conductive type, wherein the second well of the first conductive type is formed deeper than the device isolation layer;
   forming a shallow third well of the first conductive type for a base region within the first well of the second conductive type, wherein the shallow third well of the first conductive type is formed shallower than the device isolation layer; and
   simultaneously forming an emitter region within the shallow third well of the first conductive type and a collector contact within the first well of the second conductive type by performing an ion implantation process for forming source/drain regions of the metal-oxide-semiconductor transistor of the second conductive type,
   wherein the first well is formed deeper in the substrate than all other wells or regions formed in the substrate.

2. The method of claim 1, wherein the shallow third well of the first conductive type is formed by implanting approximately $2\times10^{13}$ cm$^{-2}$ to approximately $5\times10^{13}$ cm$^{-2}$ of boron with a level of energy ranging from approximately 20 KeV to approximately 30 KeV.

3. The method of claim 1, wherein the first well of the second conductive type is formed by implanting approximately $4\times10^{12}$ cm$^{-2}$ to approximately $4\times10^{13}$ cm$^{-2}$ of phosphorus with a level of energy ranging from approximately 600 KeV to approximately 1,200 KeV.

4. The method of claim 1, wherein the emitter region is formed by implanting approximately $5\times10^{15}$ cm$^{-2}$ to approximately $8\times10^{15}$ cm$^{-2}$ of arsenic with a level of energy ranging from approximately 40 KeV to approximately 50 KeV.

5. The method of claim 1,
   further comprising forming a fourth well of the second conductive type within the first well of the second conductive type,
   wherein: the fourth well of the second conductive type is formed deeper than the shallow third well of the first conductive type; and the collector contact is formed in the fourth well of the second conductive type.

6. The method of claim 5, wherein while the fourth well of the second conductive type is formed, a fifth well of the second conductive type for a metal-oxide-semiconductor transistor of the first conductive type is simultaneously formed deeper than the device isolation layer in a portion of the substrate disposed outside the first well of the second conductive type.

7. The method of claim 6, wherein a base contact electrically isolated from the emitter region is formed in the shallow third well of the first conductive type by performing an ion implantation process for forming source/drain regions of a metal-oxide-semiconductor transistor of the first conductive type.

8. The method of claim 6, wherein the shallow third well of the first conductive type is formed to have a doping level lower than the second well of the first conductive type.

9. The method of claim 6, wherein the base contact and the collector contact are isolated from each other by the device isolation layer.

10. The method of claim 6, further comprising:
    forming an anti-silicide formation layer on a portion of the base region between the emitter region and the base contact; and
    forming a silicide layer on the collector contact, the base contact and the emitter region.

11. The method of claim 8, further comprising:
    forming an anti-silicide formation layer on a portion of the base region between the emitter region and the base contact; and
    forming a silicide layer on the collector contact, the base contact and the emitter region.

12. A method for fabricating a semiconductor device, the method comprising:
    forming a first well of a second conductive type for forming a collector region of a bipolar junction transistor in a substrate of a first conductive type, wherein the substrate of the first conductive type includes a device isolation layer;
    forming a second well of the second conductive type within the first well of the second conductive type wherein the second well serves as a buffer for the collector region;
    forming a third well of the second conductive type for forming a metal-oxide-semiconductor (MOS) transistor of the first conductive type in the substrate and disposed outside the first well of the second conductive type;
    forming a fourth well of the first conductive type for forming a metal-oxide-silicon transistor of the second conductive type within the first well of the second conductive type;
    forming a base region shallower than the device isolation layers within the first well of the second conductive type;
    forming a gate electrode for the metal-oxide-semiconductor transistor of the second conductive type on the fourth well of the first conductive type and a gate electrode for the metal-oxide-semiconductor transistor of the first conductive type on the third well of the second conductive type;
    simultaneously forming source/drain regions of the second conductive type beneath both lateral sides of the gate electrode formed on the fourth well, an emitter region of the second conductive type in the base region and a plurality of collector contacts in the second wells of the second conductive type; and
    forming source/drain regions of the first conductive type beneath both lateral sides of the gate electrode formed on the third well of the second conductive type and a base contact isolated from the emitter region in the base region
    wherein the first well is formed deeper in the substrate deeper than all other wells or regions formed in the substrate.

13. The method of claim 12, wherein the base region is formed by implanting approximately $1\times10^{13}$ cm$^{-2}$ to approximately $5\times10^{13}$ cm$^{-2}$ of boron with using an energy level ranging from approximately 20 KeV to approximately 30 KeV.

14. The method of claim 13, further comprising:
    forming an anti-silicide formation layer on a portion of the base region between the emitter region and the base contact; and forming a silicide layer on the collector contact, the base contact and the emitter region.

15. The method of claim 13, wherein the base contact and the collector contact are formed to be isolated by the device isolation layer.

16. The method of claim 13, wherein the first conductive type is a p-type and the second conductive type is an n-type.

* * * * *